though the stannous ion might be linked to the dielectric surface through the agency of a linking agent which has an affinity for the stannous ion. Therefore, a primary object of this invention is to produce improved primed surfaces by the use of a linking agent.

United States Patent [19]
Feldstein

[11] 3,993,848

[45] Nov. 23, 1976

[54] CATALYTIC PRIMER

[75] Inventor: Nathan Feldstein, Kendall Park, N.J.

[73] Assignee: Surface Technology, Inc., Princeton, N.J.

[22] Filed: Feb. 18, 1975

[21] Appl. No.: 550,435

[52] U.S. Cl. ............................. 428/457; 427/304; 427/305; 427/306; 106/1; 106/287 R
[51] Int. Cl.² .......................................... C23C 3/02
[58] Field of Search .................... 427/304, 305, 306; 106/1, 287; 428/457, 469

[56] References Cited
UNITED STATES PATENTS

| | | | |
|---|---|---|---|
| 3,627,558 | 12/1971 | Roger et al. | 427/305 |
| 3,672,923 | 6/1972 | Zeblisky | 106/286 |
| 3,772,056 | 11/1973 | Polichette et al. | 427/304 |

OTHER PUBLICATIONS

Narcus, Metallizing of Plastics, pp. 14–19, Reinhold 1960.

*Primary Examiner*—Ralph S. Kendall
*Attorney, Agent, or Firm*—Joel F. Spivak

[57] ABSTRACT

In the electroless plating of dielectric or non-conductive substrates by first priming the surface of the substrate with aqueous solutions containing stannous and copper ions, followed by developing the substrate with a reducing agent capable of reducing the valence state of the copper ions, the substrate is contacted with a linking agent for the stannous ion either prior to or concurrently with the priming step permitting the use of lower amounts of stannous and copper ions while achieving improved plating and improved primer usefulness.

9 Claims, No Drawings

CATALYTIC PRIMER

BACKGROUND OF THE INVENTION

The present invention relates to electroless plating methods and to solutions used in the electroless plating of non-conductive or dielectric surfaces.

Chemical plating solutions for depositing metals by autocatalytic chemical reduction of metal ions, in solution and in contact with a catalytic surface of the article to be plated are well known. Such solutions, which do not use electricity, are referred to in the art as electroless plating solutions, and have been found to be of particular use in plating non-metallic substrates such as ceramics and plastics.

Typically, commercial prior art electroless metal plating of non-metallic substrates is accomplished by the steps of treating the substrates either with a sensitizing solution containing stannous chloride followed by treatment with an activating solution containing palladium chloride or other noble metal, or by first treating the substrate with a seeding solution containing both stannous chloride together with a stabilizer followed by treatment with an accelerator solution.

In addition to the attendant costs involved in a process of this nature due to the high cost of palladium, the high catalytic activity of the noble metals is believed to cause contamination of the electroless plating bath, and thus its decomposition. Furthermore, miscellaneous reliability problems have been encountered in printed circuitry technology; some of which are related to the presence of precious metal in the catalytic solution.

In U.S. Ser. No. 521,901, filed Nov. 8, 1974, there is described an improved process for the electroless plating of substrates, especially dielectric or non-metallic substrates which is compatible with present-day commercial procedures and equipment, which does not require the use of palladium or other noble metals, and which specifically includes the step of priming of the substrates with solutions which exhibit strong adhesion and affinity and which may be rinsed without the necessity of a drying step, and yet retain an adsorbed layer which constitutes the basis for the catalytic layer.

In general, the process described in Ser. No. 521,901 comprises the following steps:

A. Priming a dielectric substrate, which has preferably first been cleaned and etched by conventional procedures, by coating the surface of the substrate with an aqueous solution containing stannous and cuprous ions; and B. Developing the substrate primed by step (A) by reducing the valence state of the cuprous ions present on the surface, preferably by treating the primed substrate with an aqueous solution containing a reducing agent capable of reducing the valence state of the cuprous ions.

While the foregoing process, and the solutions used therein, permit significant cost reductions by the elimination of palladium and other precious metals, processes and solutions permitting even further cost savings would be highly desirable.

SUMMARY OF THE INVENTION

The present invention relates to an improved process for rendering dielectric or non-conductive substrates susceptible to plating upon immersion in suitable electroless plating baths. The present invention is further directed to solutions and systems useful in accomplishing said plating.

It is another object of the present invention to provide processes and systems for the electroless plating of dielectric or non-conductive substrates.

It is a particular object of the present invention to provide processes for the preparation of dielectric or non-conductive substrates by priming said substrates with aqueous solutions of stannous and cuprous ions followed by reduction of said cuprous ions, in which the required amounts of stannous and cuprous ions is decreased. Other objects are to provide solutions and systems for achieving said object.

Other objects of the present invention, if not specifically set forth herein, will be apparent to one skilled in the art upon the reading of the following Description of the Preferred Embodiment.

DESCRIPTION OF THE PREFERRED EMBODIMENT

The term priming as used herein refers to the step of treating a dielectric or non-conductive substrate with stannous and copper ions whether in a single step, or in separate steps, to form a coating containing stannous and cuprous ions on the surface of the substrate.

The term developing as used herein refers to the treatment of a substrate subsequent to priming with a reducing agent capable of reducing the cuprous ions present on the surface of the substrate.

In general, the process of the present invention comprises the treatment of a dielectric or non-conductive substrate with a linking agent capable of providing additional sites for stannous ion adsorption prior to or concurrently with treatment of the substrate with stannous and cuprous ions in the manner described in the aforesaid Ser. No. 521,901. More specifically, the present process comprises the following steps:

A. Coating a dielectric substrate, which has preferably first been cleaned and etched by conventional procedures, with a linking agent capable of providing sites for stannous ion adsorption.

B. Priming the substrate, concurrently with or subsequent to step (A) with an aqueous solution containing stannous and cuprous ions; and C. Developing the primed substrate by reducing the valence state of the cuprous ions present on the surface, preferably by treating the primed substrate with an aqueous solution containing a reducing agent capable of reducing the valence state of the cuprous ions.

Alternatively, step (B) may be divided into two steps, i.e., the substrate may be treated with an aqueous solution containing stannous ions followed by contacting the substrate with an aqueous solution containing copper ions. In this alternative, treatment of the substrate with the stannous ion solution may be conducted concurrently with or subsequent to step (A).

A system for use in performing the aforesaid process is comprised of the following solutions:

A. a linking agent capable of providing additional sites for stannous ion adsorption;

B. an aqueous solution of stannous ions;

C. an aqueous solution of copper ions; and

D. an aqueous solution capable of reducing the valence state of cuprous ions.

As will be apparent from the preceding description of the present process solutions (A) and (B), (B) and (C) or (A), (B) and (C) may be combined.

The linking agents contemplated by the present invention are compounds capable of providing additional sites for stannous ion adsorption. Exemplary of such compounds are phenol, ortho, meta and para cresol, hydroquinone, P-phenolsulfonic acid, P-toluene sulfonic, Hydroquinone monomethylether, B-napthol, 4,4'thiodiphenol, and 4,4'sulfynoldiphenol. The concentration of these compounds in solution will vary depending upon the particular compound used. For example, it is desirable to employ at least about 30 g/l when using phenol. On the other hand, lower amount, e.g., as low as about 5 g/l are suitable employed when using cresol as the linking agent.

With respect to solutions (B) and (C), as stated in Ser. No. 521,901, it is believed that the stannous and cuprous ions when combined, either on the surface of the substrate or in aqueous solution prior to treatment of the substrate form a stannous-cuprous complex which exhibits strong affinity for the substrate surface. Upon subsequent treatment of the complex with water and an appropriate reducing agent, the complex is first hydrolyzed to form $Cu_2O \cdot nH_2O$ and tin oxide; in turn the reducing agent reduces the ionic copper to the metallic copper on the substrate. Thus, it is desirable to insure that sufficient stannous ions are present to form a complex with cuprous ions.

In the formation of the aforesaid complex, one may begin with cupric ions which are reduced to the cuprous state by the stannous ions, the stannous ions in turn being oxidized to stannic ions. Thus, when employing cupric ions as the source of cuprous ions, sufficient additional stannous ions should be present to accomplish the reduction of the cupric ions to the cuprous state with sufficient stannous ions still being present after such reduction to form the stannous-cuprous complex.

Taking the foregoing factors into consideration, it is desirable that the ratio of stannous to cuprous ions be at least 1.1 in the solution to insure sufficient complex formation. When initially employing cupric ions as the source material, a ratio of at least 1. 5:1 stannous to cupric ions is preferably employed in order to affect the desired reduction of the cupric ions to the cuprous state, and have a 1:1 ratio of stannous:cuprous ions after such reduction. Since there is a tendency for cuprous and stannous ions to undergo oxidation to the cupric and stannic states in the presence of air, it is even more desirable to employ additional stannous ions above the aforesaid ratios in order to compensate for such oxidation. For this reason, it is more preferred to use a minimum ratio of stannous: cuprous ions of at least 3:1, and in the case of cupric ions at least 4:1.

In preparation of dielectric substrates for electroless plating using (B), (C) and (D) without treatment with solution (A), the following concentrations are generally required:

| Ion | Concentration Range (Molar) |
| --- | --- |
| Cu | 0.03 – 1.0 |
| Sn (II) | 0.12 – 15.0 |

In all cases sufficient acid, e.g., HCl, is added to insure complete dissolution. The preferred ratio of concentration of stannous ion to copper ion in the single primer is generally greater than about 4:1 where the copper is added as cupric ion and greater than about 3:1 where the copper is added as cuprous ion.

Solution (D) may be an aqueous solution of any reducing agent that will reduce the valence state of cuprous ions. A particularly suitable reducing agent is dimethylamineborane (DMAB). Other reducing agents include diethylhydroxylamine and B-N compounds such as N-alkyl-borazones and N-alkylborazoles, borazenes and borazones. The use of such compounds, with specific examples, may be found with reference to U.S. Pat. No. 3,140,188. Amine-boranes and borohydrides are especially preferred.

It is also generally preferred to incorporate wetting agents in the solutions. This is especially true when electroless plating is to take place in through-holes or otherwise recessed areas. Wetting agents are known in the art and any wetting agent useful in prior art plating solutions may be useful with the novel solutions herein. Examples of such wetting agents are the fluorinated hydrocarbons e.g. Fluorad FC-98 or FC-95 manufactured by Minnesota Mining and Manufacturing. Other surfactants, either anionic, cationic or nonionic, are also useful provided they are soluble in the acidic priming solutions without causing precipitation of active components.

In the examples which follow, ABS, because of its commercial significance, will be the substrate primarily treated. The treatment of other substrates, however, will be illustrated. It will be obvious to those skilled in the art that other plastics, adhesive coatings or other non-metallic substrates can be readily treated and that essentially all non-metallic substrates fall within the spirit of the present invention. Also, the present invention is useful in copper-clad and through-hole metallization as practiced in the printed circuitry field.

The application of electroless plating to other substrates and the treatment of the surface of these substrates including the step of preparing the substrate by cleaning in etch solution can generally be found with reference to the following publications and those other publications cited therein. The publications referred to are: Plating, June 1973, pp. 611 through 616, and U.S. Pat. Nos. 3,627,558; 3,672,923; 3,607,352; 3,011,920 and 3,425,946. These references are also applicable for typical electrolytes, stabilizers and reducing agents employed in electroless plating processes.

In the following examples, the substrates used, ABS unless otherwise indicated, are first etched by immersion of the substrate in an etching solution having the following composition for approximately 5 minutes at a temperature of 70° C.

| | |
| --- | --- |
| $CrO_3$ | 400 g/l |
| $H_2SO_4$ (conc.) | 250 ml/l |
| FC-95 (surfactant) | 0.5 g/l |

A typical compatible electroless copper bath employed in the following examples is comprised of the following ingredients in the specified amount and operated at 40° C:

| | |
| --- | --- |
| $CuSO_4 \cdot 5H_2O$ | 15 g/l |
| EDTA (40%) | 68 ml/l |
| NaOH | 9 g/l |
| NaCN | 3 ppm |
| TMN Surfactant | 0.2 (% wt) |

-continued

| | |
|---|---|
| H₂CO (37%) | 20 ml/l |

The following examples are illustrative of the present invention:

EXAMPLE I

Various etched ABS substrates were immersed in a primer solution having the following composition with various amounts of dissolved phenol forming a part of the primer solution:

| | |
|---|---|
| CuCl | 0.015 M |
| SnCl₂ | 0.060 M |
| HCl | 0.27 M |

The primed substrates were then developed by immersion in a developer solution containing 1 g/l DMAB having a pH within the range of 8 to 10.5. The following results were obtained:

| Primer Solution | Added Phenol (g/l) | Estimated Induction Time (Seconds in Electroless bath) | Per cent Metallic coverage after 5 min in Electroless |
|---|---|---|---|
| 1 | 40 | 20 | 100 |
| 2 | 30 | 35 | 100 |
| 3 | 20 | 180 | 20 |
| 4 | 10 | 300 | 5 |

EXAMPLE II

As previously indicated, the substrate may be treated with a phenol solution prior to treatment with the primer solution. To illustrate, etched ABS substrates were effectively plated by immersing the substrates first into the solution having the following composition:

| | |
|---|---|
| Phenol | 40 g/l |
| HCl | 0.54 M | followed by immersing the substrate in a primer solution having the following composition:

| | |
|---|---|
| CuCl | 0.06 M |
| SnCl₂ | 0.36 M |
| HCl | 0.54 M |

Development and plating of the substrates was effected in the manner described above. Conversely, immersion of the substrates in the primer solution prior to treatment with the phenol solution did not result in effective plating.

EXAMPLE III

Etched ABS substrates were treated with the following composition followed by developing and electroless plating in the above described manner.

| | |
|---|---|
| CuCl | 0.006 M |
| SnCl₂ | 0.06 M |
| HCl | 0.108 M |

-continued

| | |
|---|---|
| Phenol | 40 g/l |

Good initiation and metallic coverage was observed. Deletion of the phenol from the above composition, however, at best resulted in spotty plating.

EXAMPLE IV

Good initiation and plating was also observed substituting the following primer solution for the primer solution of Example 3:

| | |
|---|---|
| CuCl | 0.015 M |
| SnCl₂ | 0.015 M |
| HCl | 0.27 M |
| Phenol | 40 g/l |

EXAMPLE V

Effective electroless nickel plating of ABS substrates was achieved using a primer solution having the following composition:

| | |
|---|---|
| CuCl | 0.06 M |
| SnCl₂ | 0.36 M |
| HCl | 1.08 M |
| Phenol | 40 g/l |

Primed substrates were then developed in accordance with Example 3 and immersed in an electroless nickel bath having the following composition:

| | |
|---|---|
| Ni⁺⁺ (from a sulfamate conc.) | 8 g/l |
| DMAB | 8 g/l |
| Temperature | 40° C |

EXAMPLE VI

Effective electroless plating of copper on phenolic PC board with adhesive and through holes, nylon (etched previously in CrO₃/H₂SO₂), Vydyne (etched in CrO₃/H₂SO₄) and perforated ABS substrates. The primer solution was the same as in Example V.

EXAMPLE VII

ABS substrates, both etched and without pre-etching, were effectively plated with nickel by first immersing the substrates in the following primer solution for two minutes:

| | |
|---|---|
| CuCl | 0.06 M |
| SnCl₂ | 0.48 M |
| HCl | 1.26 M |
| Phenol | 75 g/l |

Thereafter, the substrates were immersed in a developer bath containing 1.5 g/l of DMAB at pH 11 and plated in an electroless nickel bath having the following composition at 25° C:

| | |
|---|---|
| NiSO₄ . 5H₂O | 25 g/l |
| Na₄P₂O₇ . 10H₂O | 50 g/l |

-continued

| | |
|---|---|
| NH₄OH (conc.) | 15 cc/l |
| DMAB | 1.5 g/l |

EXAMPLE VIII

To evaluate the effectiveness of various additives, next ABS substrates were treated with various primer solutions having the following composition:

| | |
|---|---|
| CuCl | 0.06 M |
| SnCl | 0.36 M |
| HCl | 0.54 M | to which the following additives were added in the amounts specified:

| Solution No. | Additive | Plating results with addition of: | | | |
|---|---|---|---|---|---|
| | | 40 g/l | 20 g/l | 10 g/l | 5 g/l |
| 1 | 4,4'oxydiphenol | poor | — | poor | — |
| 2 | 4 cyanophenol | poor | — | poor | — |
| 3 | sodium methoxide | marginal | — | poor | — |
| 4 | Resorcinol | poor | — | poor | — |
| 5 | Meta-xylene diamine | poor | — | poor | — |
| 6 | P-nitrophenol | poor | — | poor | — |
| 7 | Hydroquinone | good | — | marginal | — |
| 8 | P-phenolsulfonic acid sodium salt | good | — | poor | — |
| 9 | P-toluene sulfonic acid hydrate | good | — | poor | — |
| 10 | 4-methylthiometa cresol | poor | — | poor | — |
| 11 | Hydroquinone monomethyl-ether | good | — | poor | — |
| 12 | P-nonyloxyphenol | — | marginal | — | — |
| 13 | O-cresol | — | good | good | good |
| 14 | M-cresol | good | good | good | good |
| 15 | P-cresol | good | good | good | good |
| 16 | phenol | good | marginal | poor | poor |
| 17 | 4 ethylphenol | good (solid phase) | — | poor | — |
| 18 | B-naphthol | — | — | poor (ppt) | good |
| 19 | 4,4'thiodiphenol | — | — | poor (ppt) | good |
| 20 | 4,4'sulfynoldiphenol | — | — | marginal (ppt) | good |
| 21 | 2,4',2''nitrilotriethanol | — | — | poor | — |
| 22 | 4-hydroxybenzophenone | — | — | poor (2nd phase) | — |
| 23 | P-ethoxyphenol | marginal (ppt) | — | poor | — |
| 24 | phenolsulfonic acid | poor | — | poor | — |
| 25 | Tergitol 15-S-3 | marginal (2nd phase) | — | poor (2nd phase) | — |
| 26 | 8-tuinolinol | — | marginal (ppt) | marginal (ppt) | — |

EXAMPLE IX

In order to compare the effectiveness of phenol in Sn/Cu systems with the effect of phenol of Sn/Pd systems of the prior art, etched ABS substrates were immersed in an aqueous solution containing 40 g/l phenol and 0.54 M HCl. The pre-treated substrates were then immersed in Sn/Pd solutions diluted in increments and then immersed for five minutes in a developer solution containing 0.1 g/l DMAB at pH 8.5.

Substrates were similarly treated with the elimination of the immersion in the phenol solution from the procedure. Examination of the substrates was used to estimate the extent by which the catalytic site density varied. It was noted that, in all cases, a darker surface was obtained in the absence of the phenol step. Hence, the behavior of phenol in the Sn/Cu/acidic primer solutions is not the same as in the Sn/Pd/acidic primer solutions.

In addition to electroless plating with copper or nickel, it is also possible to plate the treated substrates with cobalt by immersion in a suitable bath, a typical example of which is as follows:

| | |
|---|---|
| $CoSO_4 \cdot 7H_2O$ | 25 g/l |
| Disodium Succinate $\cdot 6H_2O$ | 25 g/l |
| DMAB | 4 g/l |
| pH adjusted to 6.7 by addition of 0.1 M HCl | |

EXAMPLE X

A procedure similar to Example 2 was used, except that 10 g/l of m-cresol was used instead of phenol. Good plating took place at the end of the cycle.

EXAMPLE XI

A primer solution was used comprised of:

| | |
|---|---|
| $SnCl_2$ | 0.072 M |
| CuCl | 0.012 M |
| HCl | 0.108 M |
| m-cresol | 10 g/l |

Good metallic coverage was noted with dilution of the main components of the primer solution.

It will be obvious to one skilled in the art that in order for the electroless plating process to initiate onto pre-treated catalytic surfaces, certain basic requirements must be met. For example, the catalytic specie(s) present on the surface must interact with the reducing agent(s) present in the electroless plating bath. In this respect it is well known in the art that Ni-P type deposits (derived from hypophosphite containing baths) do not self initiate upon copper surfaces; however, Ni-B type deposits (derived from dimethylamine borane containing baths) do initiate on same copper surface. The difference encountered is due to the choice of the reducing agent present. It is further possible that the initiation of the plating process takes place first via a galvanic replacement type reaction of the metallic ions in solution with the catalytic surface. A typical example is the immersion of a copper substrate into an electroless gold plating formulation.

It will be apparent to one skilled in the art that many modifications and variations of the invention previously described may be made without departing from the spirit and scope thereof. For example it is possible to combine the development step with the electroless plating step by using an electroless plating bath containing an appropriate reducing agent. This alternative is believed to be less desirable, however, due to possible contamination of the plating bath. Also, oxidation of the cuprous ions to the cupric state can be inhibited by the presence in the cuprous solution of metallic copper, e.g., copper shot, which serves to return cupric ions to the cuprous state through reduction.

I claim:

1. An improved process for preparing a non-metallic substrate for electroless plating comprising:
   A. Treating the substrate with a linking agent capable of providing sites for stannous ion adsorption on said substrate without cleaning in a manner which would cause removal of said linking agent;
   B. Priming said substrate with stannous and copper ions from a composition in which the ratio of stannous to cuprous ions is at least 1:1; and
   C. Reducing the valence state of said copper ions to their metallic state.

2. The process of claim 1, wherein steps (A) and (B) are performed concurrently.

3. The process of claim 1, wherein said linking agent is selected from the group consisting of phenol, cresol and mixtures thereof.

4. The process of claim 1, wherein said contacting of said substrate with said linking agent is effected by immersing said substrate in an aqueous solution containing at least about 30 g/l of phenol.

5. The process of claim 1, wherein said contacting of said substrate with said linking agent is effected by immersing said substrate in an aqueous solution containing at least about 5 g/l of cresol.

6. The process of claim 1, wherein said copper ions are reduced with a reducing agent selected from the group consisting of amine-boranes, borohydrides and mixtures thereof.

7. The process of claim 1 in which the primer composition comprises ionic tin in both of its oxidation states.

8. The process of claim 2 in which the primer composition comprises tin in its stannous and stannic oxidation states.

9. An electrolessly metallized non-conductor article produced by the steps including:
   a. Contacting said article with a composition comprising stannous and copper ions and a linking agent in which the ratio of stannous to cuprous ions is at least 1:1.
   b. reducing the valence state of said copper ions to their metallic state; and
   c. electrolessly plating.

* * * * *